United States Patent
Leong et al.

(10) Patent No.: US 7,701,069 B2
(45) Date of Patent: Apr. 20, 2010

(54) SOLDER INTERFACE LOCKING USING UNIDIRECTIONAL GROWTH OF AN INTERMETALLIC COMPOUND

(75) Inventors: Kum Foo Leong, Kedah (MY); Siew Fong Tai, Selangor (MY); Chee Key Chung, Penang (MY)

(73) Assignee: Intel Corporation, Santa Clara, CA (US)

( * ) Notice: Subject to any disclaimer, the term of this patent is extended or adjusted under 35 U.S.C. 154(b) by 432 days.

(21) Appl. No.: 10/610,168

(22) Filed: Jun. 30, 2003

(65) Prior Publication Data

US 2005/0012216 A1    Jan. 20, 2005

(51) Int. Cl.
*H01L 23/48* (2006.01)

(52) U.S. Cl. .................. 257/779; 257/673; 257/774; 257/782; 257/E23.015

(58) Field of Classification Search ................. 257/701, 257/706, 704, 752, 758, 778, 751, 787, 737, 257/738, E23.01, E21.476, 797, 678, 637, 257/774, 779, 782

See application file for complete search history.

(56) References Cited

U.S. PATENT DOCUMENTS

| | | | | |
|---|---|---|---|---|
| 3,617,816 A | * | 11/1971 | Riseman et al. ............. | 361/160 |
| 3,965,552 A | * | 6/1976 | Rutt ......................... | 29/25.42 |
| 6,121,688 A | * | 9/2000 | Akagawa .................... | 257/778 |
| 6,191,023 B1 | * | 2/2001 | Chen ......................... | 438/612 |
| 6,414,506 B2 | * | 7/2002 | Akram et al. ............... | 324/765 |
| 6,472,763 B2 | * | 10/2002 | Fukuda et al. .............. | 257/780 |
| 6,541,303 B2 | * | 4/2003 | Akram et al. ............... | 438/106 |
| 6,541,365 B2 | * | 4/2003 | Edwards et al. ............. | 438/612 |
| 6,590,295 B1 | * | 7/2003 | Liao et al. ................... | 257/781 |
| 6,897,570 B2 | * | 5/2005 | Nakajima et al. ........... | 257/786 |
| 6,980,017 B1 | * | 12/2005 | Farnworth et al. .......... | 324/765 |

* cited by examiner

*Primary Examiner*—Wai-Sing Louie
(74) *Attorney, Agent, or Firm*—Blakely, Sokoloff, Taylor & Zafman LLP

(57) ABSTRACT

A ball grid array device includes a substrate, further including a first major surface and a second major surface. An array of pads is positioned on one of the first major surface or the second major surface. At least some of the pads include a barrier layer having pores or openings therein. When solder is placed on the pad, the barrier layer forms an intermetallic compound at a rate different from the rate of the intermetallic compound formed between the pad and the solder. The result is a solder ball on a pad that has a first intermetallic compound and a second intermetallic compound.

25 Claims, 6 Drawing Sheets

SOLDER INTERFACE LOCKING USING UNIDIRECTIONAL GROWTH OF AN INTERMETALLIC COMPOUND

FIELD OF THE INVENTION

The present invention is related to ball grid array packages. More specifically, the present invention relates to methods and apparatus for solder interface locking using unidirectional growth of an intermetallic compound.

BACKGROUND OF THE INVENTION

The semiconductor industry has seen tremendous advances in technology in recent years that have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled semiconductor device packages. A by-product of such high density and high functionality in semiconductor devices has been the demand for increased numbers of external electrical connections to be present on the exterior of the die, and on the exterior of the semiconductor packages that receive the die, for connecting the packaged device to external systems, such as a printed circuit board.

To meet the demand for an increased number of external electrical connections, ball grid array packages were developed and are now used in many applications. A ball grid array (BGA) is an array of solder bumps or balls that cover the surface of the die or semiconductor package and are used to connect the die and the semiconductor package. A typical BGA package is characterized by a large number of solder balls disposed in an array on a major surface of the package. It is not uncommon to have hundreds of solder balls in an array. The BGA package is assembled to a matching array of conductive pads. The pads are connected to other devices within a substrate, or circuitry on a circuit board. Heat is applied to reflow the solder balls (bumps) on the package, thereby wetting the pads on the substrates and, once cooled, forming electrical connections between the package and the semiconductor device contained in the package, and the substrate.

BGAs have the advantage of providing more connections between the die and the semiconductor package. BGAs also have the advantage that the size of the balls or bumps can be made smaller to provide a higher density of solder bumps or balls, and thereby a greater number of connections from a die. BGAs are formed by placing an amount of solder on a solder pad and heating the solder to a melting point. The surface tension associated with the liquid solder causes the solder to form a solder ball. The solder ball retains its shape as it cools to form a solid solder ball or bump.

Two basic types of BGA pads for interconnection include a metal defined flat pad (MD) type BGA, and a solder mask defined flat pad (SMD) type BGA. Both of these two types of BGA pads are shown in FIGS. 1 and 2 of the attached drawings. The solder adheres to the metal of the pad and not to the non-metallic substrate. In the metal defined flat pad type BGA, shown in FIG. 1, a metal pad 100 is initially formed on a substrate 110. Solid solder 120 is applied with the assistance of rosen flux, followed by heating the solder to molten stage. The surface tension associated with the liquid or molten solder 120 forms the solder into a solder ball 120. The solder 120 adheres to the entire metal pad 100. In the solder mask defined flat pad type of BGA, shown in FIG. 2, a metal pad 100 is initially formed on a substrate 110. Then a solder mask 200 is laid down to further limit the opening portion of the metal pad 100 that the solder adheres to. In other words, the solder of the solder ball 120 formed adheres only to the uncovered or unmasked portion 112 of the metal pad 100. The solder adheres to the metal and not the solder mask. The surface tension associated with the liquid or molten solder 120 forms the solder into a solder ball 120.

In either type of BGA, brittle fractures may develop due to mechanical bending, which can result in a separation interface between the solder matrix and the component pad. Fatigue failure can also result in a crack propagating across the pad, especially when a solder mask is used to limit the area of the metal pad 100 that the solder adheres to. Cracks can result in failed solder joints, that in turn result to electrical open failure of electronic device.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures, and:

The description set out herein illustrates the various embodiments of the invention, and such description is not intended to be construed as limiting in any manner.

DETAILED DESCRIPTION

In the following detailed description of the preferred embodiments, reference is made to the accompanying drawings that form a part hereof, and in which are shown by way of illustration specific embodiments in which the invention can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of present inventions. The following detailed description, therefore, is not to be taken in a limiting sense, and the scope of various embodiments of the invention is defined only by the appended claims, along with the full range of equivalents to which such claims are entitled.

Figure 3:
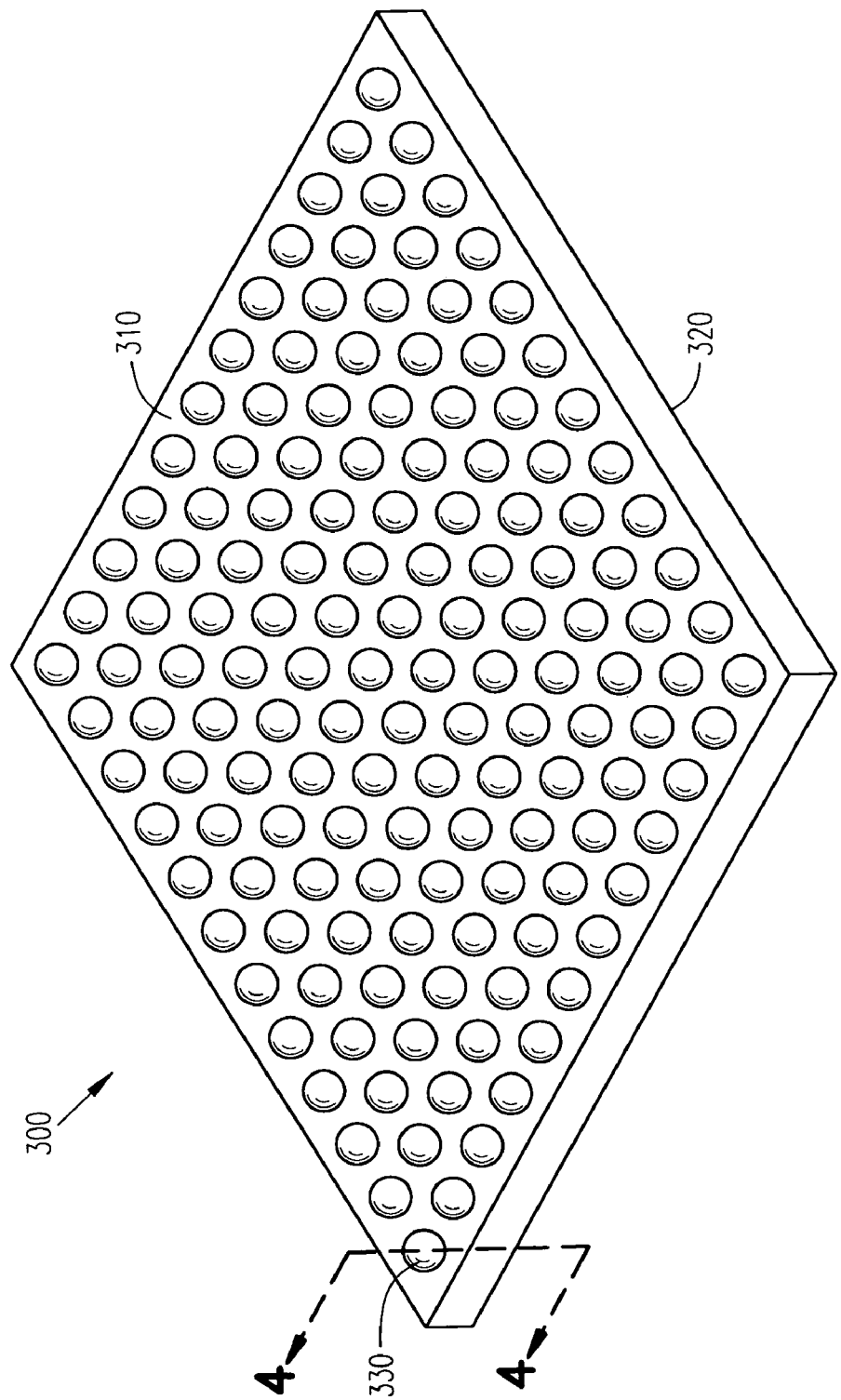
FIG. 3 illustrates a perspective view of a BGA device, that incorporates an embodiment of this invention.

FIG. 3 illustrates a perspective view of a BGA device 300 that incorporates an embodiment of this invention. The BGA device includes a first major surface 310 and a second major surface 320. Positioned in an array on the first major surface 310 are a plurality of pads (not shown). Each of the pads (not shown) is covered by a solder ball 330 according to an embodiment of this invention. The solder balls in an array form the ball grid array device. Each of the solder balls 330 acts as a lead to electrical circuitry or pathways within the ball grid array device 300.

Figure 4:
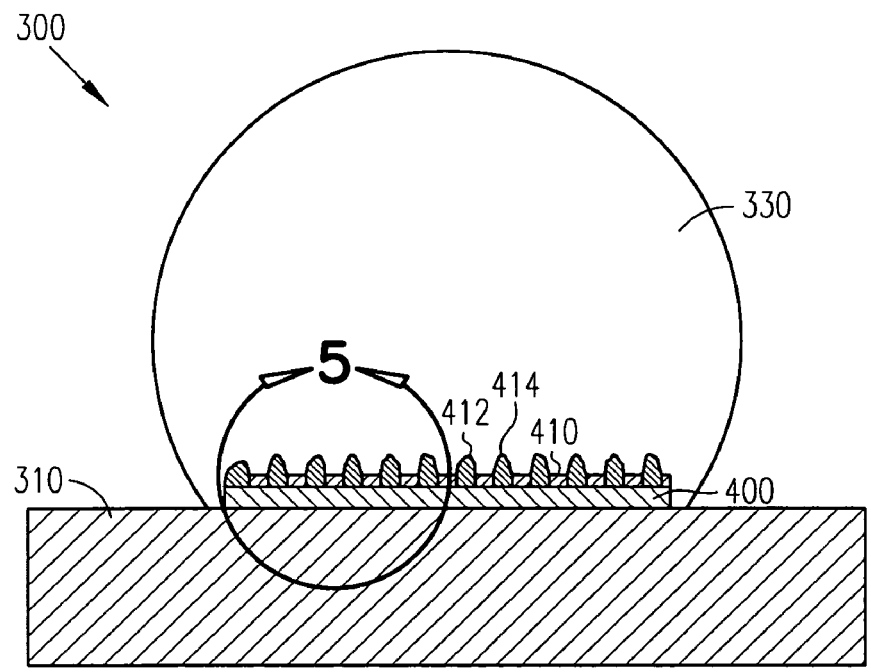
FIG. 4 illustrates a cross-sectional view of a solder ball along line 4-4 of FIG. 3, attached to a land in a BGA device, according to an embodiment of this invention.

FIG. 4 illustrates a cross-sectional view of a solder ball 330 along a line 4-4 shown in FIG. 3, attached to a land 400 in a BGA device 300. The solder ball 330 is attached to the first major surface 310 of the BGA device 300. More specifically, the solder ball 330 is attached to a land or pad 400, which is attached to the first major surface 310 of the BGA device. The pad or land 400 is typically made of a first material, such as copper. A barrier layer 410 is placed over the pad or land 400. The barrier layer 410 has openings 412 and 414. The barrier layer is made of a second material, such as nickel (Ni). Before the solder ball 330 is placed onto the pad 400 covered with the barrier layer 410, the solder is a different material from either the pad 400 or the barrier layer 410. When the solder ball 330 is initially placed onto the pad 400 and barrier layer 410, the solder and the various materials of the barrier layer 410 and of the pad 400 intermix to form an intermetallic compound (IMC). Thus, when the solder ball 330 is placed onto the pad 400, two separate IMCs are formed.

Figure 5:
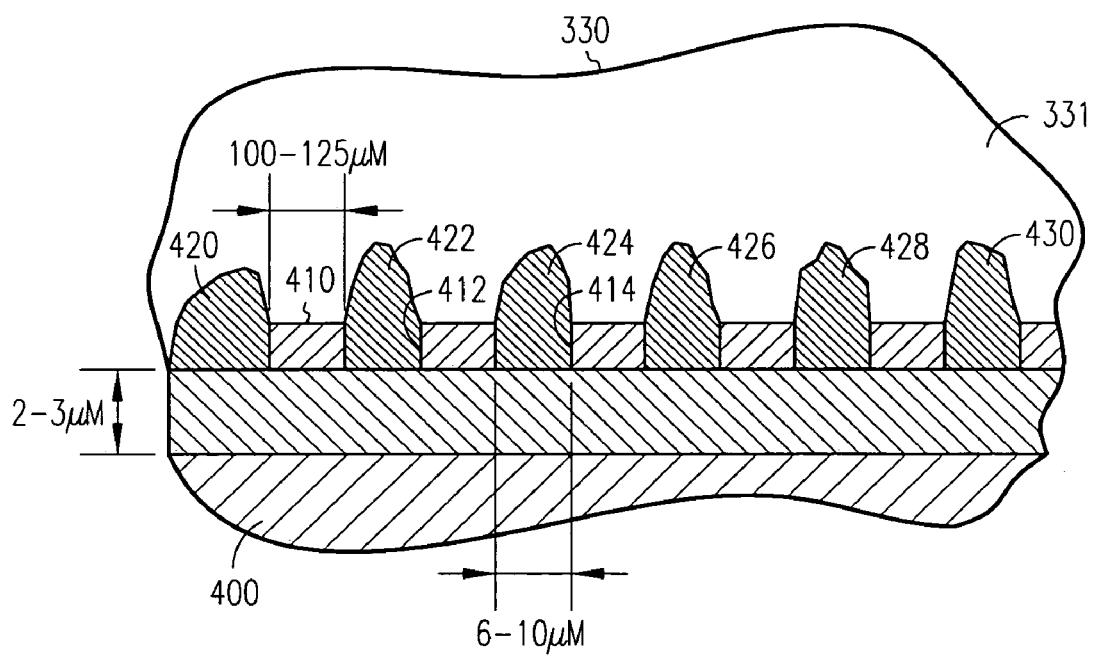
FIG. 5 illustrates a close-up cross-sectional view of a solder ball attached to a portion land in a BGA device, according to an embodiment of this invention.

IMC formation and growth affects the reliability of solder joints. FIG. 5 illustrates a close-up cross sectional view of the solder ball 330 attached to a portion of the land 400 in the BGA device 300, according to an embodiment of this invention. Now referring to both FIGS. 4 and 5, the details of the attachment of the solder ball 330 to the land 400 having a barrier layer 410 will now be discussed. The growth rate is linear with the square root of time at a specific temperature and exponential with temperature. The growth of the IMC for a particular mixture is controlled by the diffusion of interacting atoms at the interface. IMCs properties are strong with a high modulus. The material associated with the pad or land has a first dissolution rate. The barrier layer 410 is selected so that it has a lower dissolution rate than the material of the pad or land 400. For example, the base metal associated with the pad 400 is copper, and the solder material is a mixture of tin and lead (Sn—Pb). The barrier layer 410 of nickel is placed onto the base metal or pad 400 to control the IMC growth formed when the solder ball 330 is formed and heated to reflow the solder. The growth rate of the IMC ($Ni_3Sn_4$) associated with the barrier layer is slower than the growth rate of the IMC ($Cu_6Sn_5$) associated with the pad. The result is that there will be two IMCs formed at the interface between the pad 400 and the solder ball 330. Since the IMC associated with the copper pad forms or grows more quickly than the IMC associated with the barrier layer 410, the effect is that there will be $Cu_6Sn_5$ nodules 420, 422, 424, 426, 428 and 430 which extend above the IMC layer ($Ni_3Sn_4$) formed at the interface of the barrier layer 410 and the solder ball 330. The $Cu_6Sn_5$ nodules are fingerlike structures that extend into the solder ball or solder matrix 331. The end result is the formation of a first IMC associated with the barrier layer ($Ni_3Sn_4$) and a second IMC associated with the pad ($Cu_6Sn_5$). Since the growth rates or formation rates of the IMCs are different, the height of the IMCs or the distance to which the IMCs extend into the solder matrix of the solder ball 330 is different. This produces an uneven border or an uneven height between the first IMC and the second IMC. The uneven IMCs enhance reliability performance.

Figure 1:
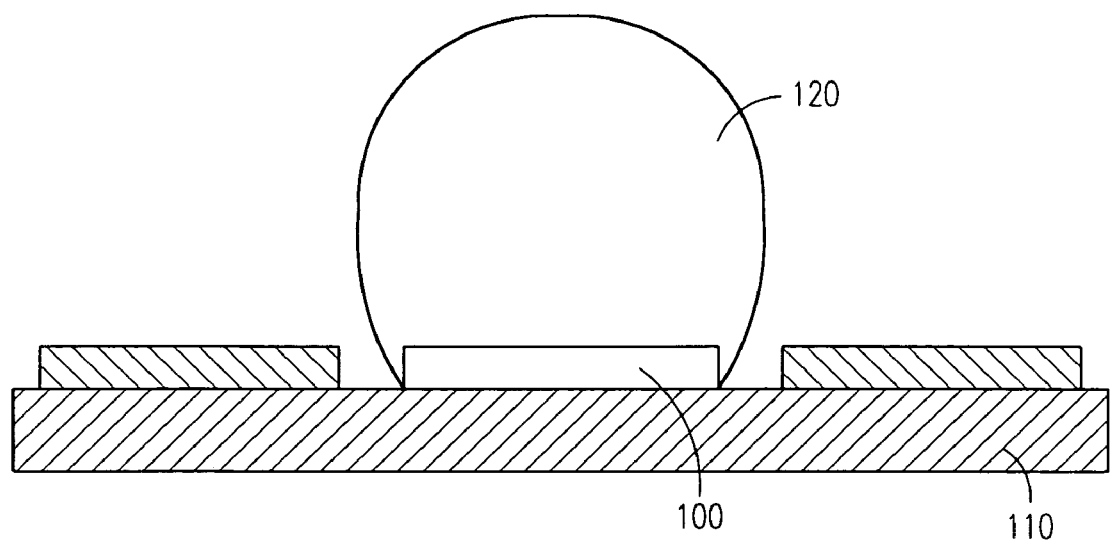
FIG. 1 illustrates a schematic view of a metal defined flat pad associated with a BGA device.
Figure 2:
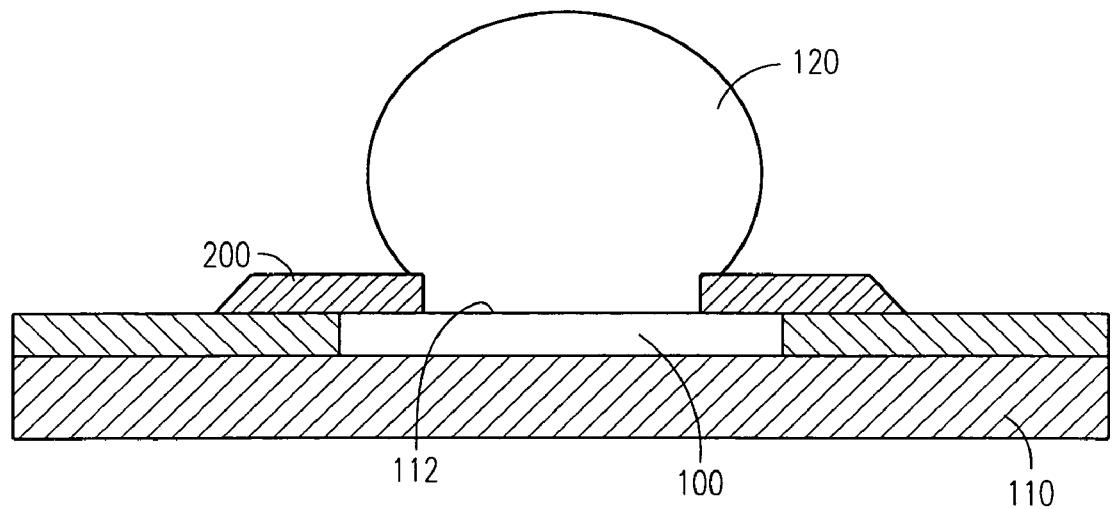
FIG. 2 illustrates a schematic view of a solder mask defined flat pad associated with a BGA device.
Figure 6:
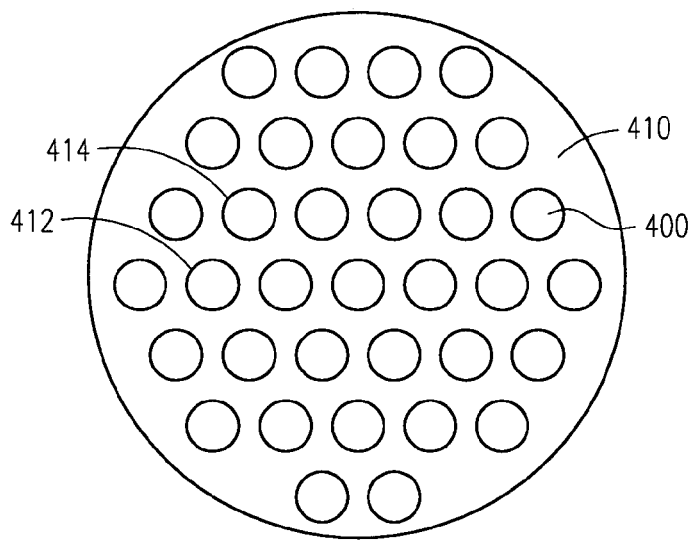
FIG. 6 illustrates a top view of a barrier layer on a land of a BGA device, according to an embodiment of this invention.

FIG. 6 illustrates a top view of a barrier layer 410 on a land 400 of a BGA device 300 (shown in FIGS. 1-3) according to an embodiment of this invention. The barrier layer 410 includes openings such as 412, 414. Although the openings 412, 414 shown are circular, it should be noted that the openings can be of any geometric shape. The land or pad 400 can be seen through the various openings, such as 412, 414 in the barrier layer 410. The openings, such as 412, 414, in the barrier layer 410 are evenly distributed on the pad or land 400. In some embodiments, the openings form a porous structure. The diameter of each opening is in the range of 4 to 6 micrometers and the total area of the openings is in the range of 40-60% of the pad area. As a result, the total area of the pad 400 which is exposed or uncovered by the barrier layer 410 is also in the range of 40-60%. The distance between the individual openings is approximately in the range of 100-125 micrometers. The barrier layer, or specifically the openings in the barrier layer, are dimensioned so as to allow the solder to directly contact the copper or material of the pad 400. The openings are also dimensioned so as to promote or assure unidirectional growth of the IMC formed between the solder and the copper pad 410. This results in growth of the IMC nodules 420, 422, 424, 426, 428, 430 (shown in FIG. 5) which is essentially or substantially orthogonal to the pad or land 400. Since the growth rate of the IMC associated with the solder and the copper of the pad 400 is faster than the growth rate of the IMC formed between the barrier layer 410 and the solder, the copper IMC which grows through the openings 412, 414 is expected to protrude out beyond the barrier layer 410. Thus, the openings in the barrier layer 410 promote unidirectional growth of the nodules or fingerlike structures 420, 422, 424, 426, 428, 430 (shown in FIG. 5) which is substantially orthogonal to the copper land or pad 400. Since the distance between the openings 412, 414 and the barrier layer 410 is approximately 100 to 125 micrometers, the distance between the IMC nodules or fingerlike structures is also in the range of 100 to 125 micrometers.

FIGS. 1-7B show the invention used as part of a BGA device. It should be noted that the invention is not limited to a BGA device. The invention can be used in any electronic device. Consequently, an electronic device includes a pad 400, a ball 330 of solder material attached to the pad 400, a first intermetallic compound formed between the pad 400 and the solder material, and a second intermetallic compound formed between the barrier layer 410 and the solder material. The first intermetallic compound is different from the second intermetallic compound. One of the first or second intermetallic compounds forms at least one structure 420 that extends beyond the pad 400 and into the other of the first or second intermetallic compounds. In some embodiments, one of the first or second intermetallic compounds forms a plurality of structures 420, 422, 424, 426, 428, 430 that extend beyond the pad and into the other of the first or second intermetallic compounds. The plurality of structures 420, 422, 424, 426, 428, 430 are substantially orthogonal to the pad and are finger-like. The pad 400 includes a base of a first material and a covering 410 of a second material. The covering 410 includes a plurality of openings 412, 414 therein. In some embodiments, the covering 410 is porous.

Again, returning to the ball grid array device example shown in FIG. 3, the ball grid array device 300, in some embodiments, includes a substrate that further includes a first major surface 310, a second major surface 320, and an array of pads 400 positioned on one of the first major surface 310 or the second major surface 320. At least some of the pads 400 include a barrier layer 410. In some embodiments, the barrier layer 410 has an opening 412 therein. In other embodiments of the invention, the barrier layer has a plurality of openings therein The barrier layer 410 is made of a material different from the material of the at least some of the pads 400. A solder ball 330 formed of a solder is formed on the pads 400 having the barrier layers 410. The barrier layer 410 material forms a first intermetallic compound with the solder at a first rate, while the pad material forms a second intermetallic compound at a second rate. The first rate of forming intermetallic compound is slower than the second rate of forming intermetallic compound. In some embodiments, the barrier layer 410 is nickel and the pad 400 material is copper.

In some embodiments, the barrier layer 410 has a plurality of substantially evenly spaced openings 412, 414 therein. The openings 412, 414 in the barrier layer 410 expose a portion of the pad 400. In some embodiments, the amount of pad 400 that is exposed is in the range of 40% to 60%. The diameter of the openings 412, 414 in the barrier layer are in the range of 6 μm to 10 μm, and the distance between the openings in the barrier layer is in the range of 100 μm to 125 μm. The barrier layer has a thickness in the range of 2 μm to 3 μm. In short, the openings 412, 414 in the barrier layer 410 are dimensioned so that the material of the pad 400 beneath the barrier layer forms an intermetallic compound substantially orthogonal to the pad through the openings and beyond the barrier layer.

Figure 7A:
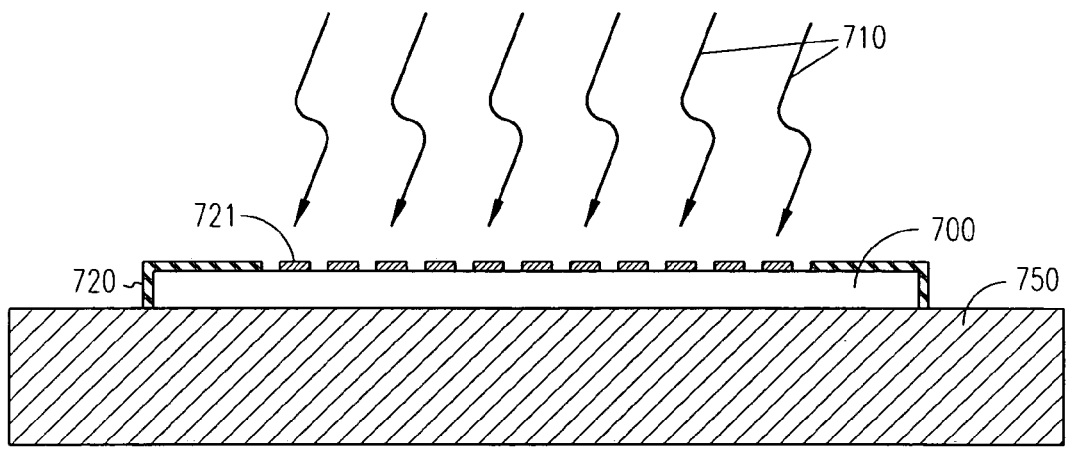
FIG. 7A illustrates a schematic cross-sectional side view of a pad of a BGA device during the process of forming a barrier layer on the pad, according to an embodiment of this invention.
Figure 7B:
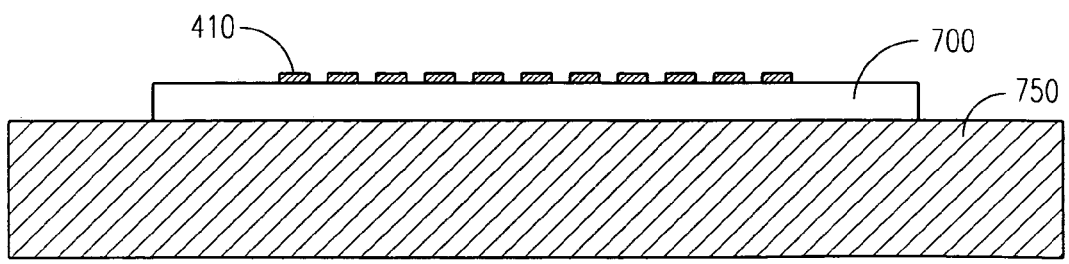
FIG. 7B is a cross-sectional schematic showing another step in a process for forming a barrier layer on the pad of a BGA device, according to an embodiment of this invention.

FIGS. 7A and 7B illustrate schematic cross-sectional side views of a pad 700 of a BGA device during the process of forming a barrier layer over the pad 700. The pad 700 is attached to a substrate 750. It should be noted that only one pad 700 is shown and that the process is shown with respect to only one pad. It should be understood that this process is carried on for multiple pads or all the pads associated with the substrate 750 at essentially the same time, so that the multitude of pads 700 on a substrate have the barrier layer formed by this process at the same time. The starting point of the process is shown in FIG. 7A. The substrate 750 has a copper pad 700 positioned on the substrate. A certain amount of processing has to occur to form the copper pad 700 onto the component substrate. However, applicant has chosen not to go into the details of the process associated with placing a copper pad 700 onto a component substrate 750. The initial step is to place a mask 720 over the component substrate. The mask 720 is etched to form a shape within the mask that corresponds to the shape of the corresponding barrier layer (such as is shown in FIG. 6). Portions of the mask 720, such as portion 721, correspond to the openings 412, 414 in the mask. Once the mask has been formed so that the shape removed corresponds to the barrier layer, the next step is to coat the mask 720 and the copper pad 700 with barrier layer material as depicted by the dotted curved lines with arrowheads carrying the reference numeral 710. After the barrier layer material has been applied to the component pad 700, the mask layer is removed as shown in FIG. 7B. After the mask layer is removed, it leaves the barrier layer 410 on top of the copper pad or land 700 on the component substrate 750.

Figure 8:
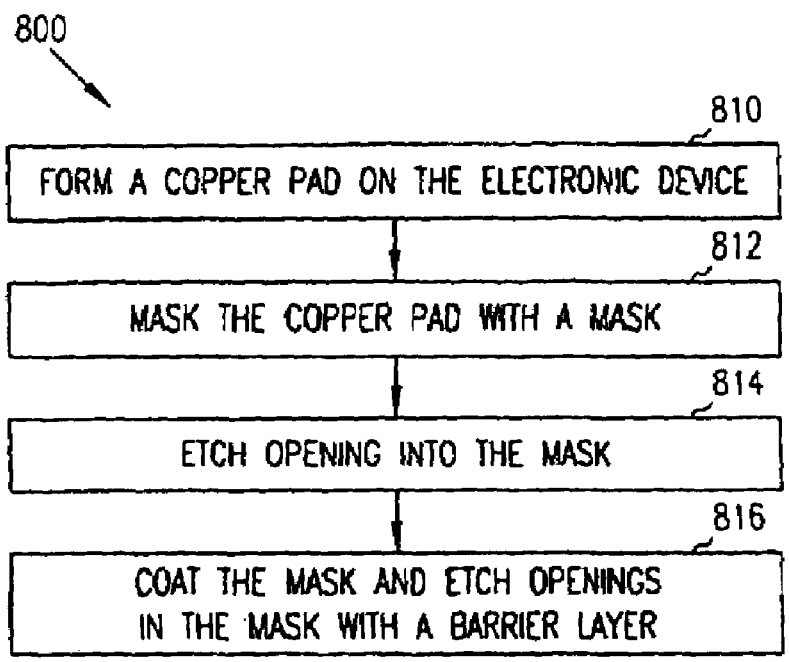
FIG. 8 is a flow diagram showing a method for forming a solder ball onto a pad of an electronic device, according to an embodiment of this invention.

FIG. 8 is a flow diagram showing a method for forming a solder ball on a pad of an electronic device 800 according to an embodiment of this invention. The method for forming a pad on an electronic device 800 includes forming a copper pad on the electronic device 810, masking the copper pad with a mask 812, etching openings into the mask 814, and coating the mask and etched openings in the mask with a barrier layer 816. The method also includes removing the mask 818.

Figure 9:
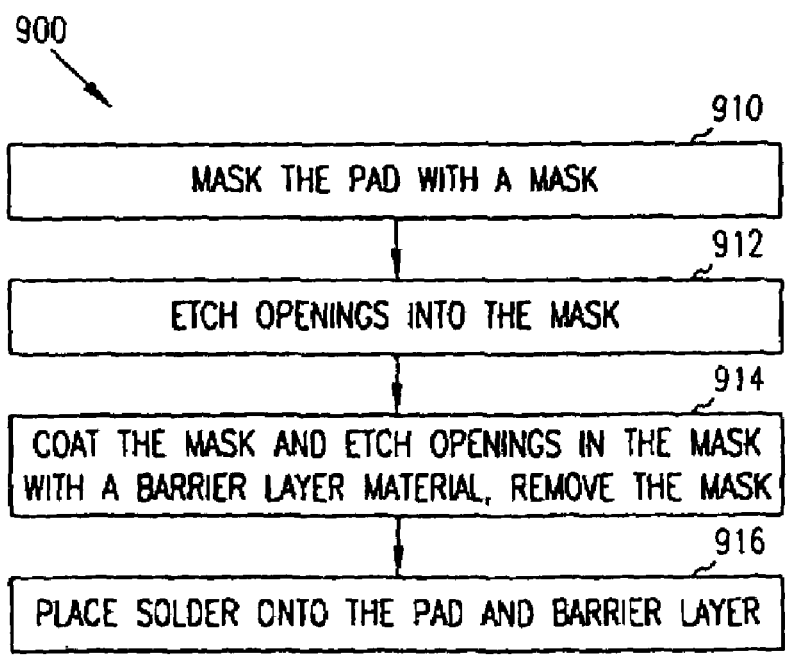
FIG. 9 is a flow diagram showing a method for forming a solder ball onto a pad of an electronic device, according to another embodiment of this invention.

FIG. 9 is a flow diagram showing a method for forming a solder ball on a pad of an electronic device 900, according to an embodiment of the invention. The method for forming a solder ball onto a pad of an electronic device includes masking the pad with a mask 910, etching openings into the mask 912, coating the mask and etched openings in the mask with a barrier layer material 914, removing the mask 916, and placing solder onto the pad and barrier layer 918. Placing the solder onto the pad further includes forming a first intermetallic compound between the material of the pad and the solder at a first rate, and forming a second intermetallic compound between the material of the barrier layer and the solder at a second rate. Coating the mask and etched openings in the mask with a barrier layer material further includes selecting a barrier layer material that forms a second intermetallic compound between the material of the barrier layer and the solder at a slower rate than a first rate of forming a first intermetallic compound between the material of the pad and the solder.

Figure 10:
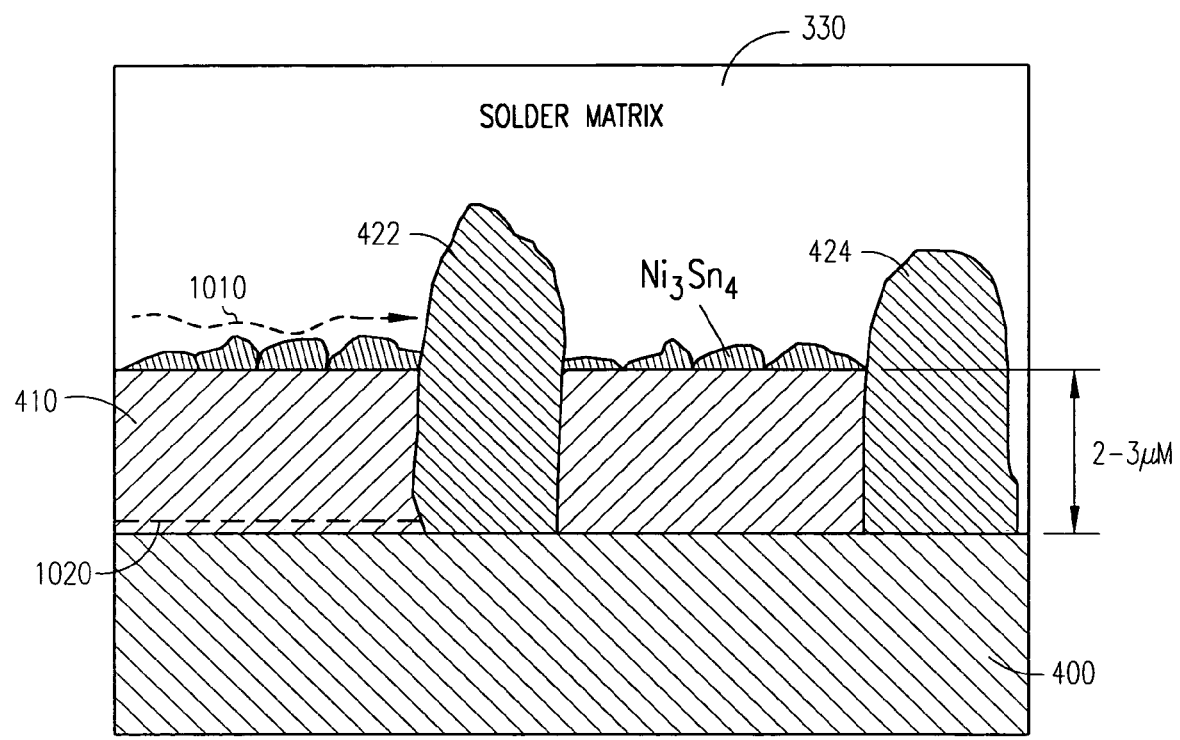
FIG. 10 is cross-sectional schematic showing a fatigue crack and a brittle crack in a pad and solder ball formed according to an embodiment of this invention.

FIG. 10 is a cross-sectional schematic diagram showing a fatigue crack 1010 and a brittle crack 1020 in a pad and solder ball formed according to an embodiment of this invention. It should be noted that the fatigue crack 1010 and the brittle crack 1020 are not part of this invention; however, FIG. 10 shows why having two different intermetallic materials which form nodules 422, 424 through the barrier layer 410 increases reliability of the formed part. A fatigue crack 1010 or a brittle crack 1020 may begin to propagate or occur during the life of the solder contact. The reliability of the use of a barrier layer 410 to grow or produce two IMC materials, one of which forms nodules or fingerlike structures 422, 424 which protrude up from the barrier layer 410, is that when a fatigue crack 1010 or a brittle crack 1020 begins to propagate, the nodules or fingerlike structures 422, 424 block the propagation of the fatigue crack 1010 or the brittle crack 1020. As a result, the nodules or fingerlike structures 422, 424 effectively block fatigue crack 1010 and brittle crack 1020 propagation. In other words, the nodules or fingerlike structures 422, 424 isolate fatigue cracks 1010 or brittle cracks 1020. If the fatigue crack 1010 or the brittle crack 1020 is isolated or cannot propagate across the pad or land 400, then the solder ball will remain commutatively coupled to the land 400. As a result the part will not fail, or is less likely to fail, because of the structure form as shown in FIG. 10.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A ball grid array device comprising:
    a substrate, further including:
        a first major surface; and
        a second major surface; and an array of pads positioned on one of the first major surface or the second major surface, at least some of the pads including a barrier layer thereon, the barrier layer made of a material that forms an intermetallic material with a solder, the barrier layer having a plurality of openings therein over the surface of at least one of the array of pads.

2. The ball grid array device of claim 1 wherein the barrier layer is made of a material different from the material of the at least some of the pads.

3. The bail grid array device of claim 1 further comprising a solder ball formed on the pads having barrier layers, wherein the barrier layer material forms a first intermetallic compound with the solder at a first rate, and the pad material forms a second intermetallic compound with the solder at a second rate.

4. The ball grid array device of claim 3 wherein the first rate is slower than the second rate.

5. The ball grid array device of claim 3 wherein the barrier layer is nickel and the pad material is copper.

6. The ball grid array device of claim 1 wherein the barrier layer has a plurality of substantially evenly spaced openings therein.

7. The ball grid array device of claim 6 wherein the openings in the barrier layer expose a portion of the pad in the range of 40% to 60%.

8. The ball grid array device of claim 6 wherein the diameter of the openings in the barrier layer are in the range of 6 μm to 10 μm.

9. The ball grid array device of claim 8 wherein the distance between the openings in the barrier layer is in the range of 100 μm to 125 μm.

10. The ball grid array device of claim 6 wherein the barrier layer has a thickness in the range of 2 μm to 3 μm.

11. The ball grid array device of claim 6 wherein the openings in the barrier layer are dimensioned so that the material of the pad beneath the barrier layer forms an intermetallic compound substantially orthogonal to the pad through the openings and beyond the barrier layer.

12. The ball grid array device of claim 3 wherein one of the first intermetallic compound or the second intermetallic compound forms a finger extending into the solderball further from the barrier than the other of the first intermetallic compound or the second intermetallic compound.

13. The ball grid array device comprising:
a substrate, further including:
a first major surface; and
a second major surface;
an array of pads positioned on one of the first major surface or the second major surface, at least some of the pads including a barrier layer,
a solderball formed on the pads having a barrier layer, wherein the barrier layer has a plurality of openings therein, the barrier layer material forming a first intermetallic compound with the solder at a first rate, and the pad material forming a second intermetallic compound with the solder at a second rate, and
wherein one of the first intermetallic compound and the second intermetallic compound forms a finger extending from the plurality of openings in the barrier layer and into the solderball further from the barrier than the other of the first intermetallic compound and the second intermetallic compound.

14. The ball grid array device of claim 13 wherein the material forming the barrier layer forms a first intermetallic compound with the solder at a first rate slower than the second rate.

15. The ball grid array device of claim 3 wherein one of the first or second intermetallic compounds forms at least one structure that extends beyond the pad and into the other of the first or second intermetallic compounds.

16. The ball grid array device of claim 3 wherein one of the first or second intermetallic compounds forms a plurality of structures that extends beyond the pad and into the other of the first or second intermetallic compounds.

17. The ball grid array device of claim 16 wherein the plurality of structures that extend beyond the pad are substantially orthogonal to the pad.

18. The electronic device of claim 16 wherein the plurality of structures that extend beyond the pad are finger-like.

19. The ball grid array device of claim 1 wherein the barrier layer is substantially porous.

20. The ball grid array device of claim 3 wherein the first intermetallic compound and the second intermetallic compound forms an uneven joint between the pad and the solderball.

21. The ball grid array device of claim 3 wherein the first intermetallic compound and the second intermetallic compound join the pad and the solderball.

22. The ball grid array device of claim 1 wherein the barrier is deposited on at least one of the pads.

23. A ball grid array device comprising:
a substrate, further including:
a first major surface; and
a second major surface; and
an array of pads positioned on one of the first major surface or the second major surface, at least some of the pads including:
a first material capable of forming a first intermetallic material with a solder; and
a second material capable of forming a second intermetallic material with the solder, the first and second material at the exposed surface of the pad.

24. The bail grid array device of claim 23 wherein the first material and the second material are metals.

25. The ball grid array device of claim 23 further comprising a solder ball of solder formed on the pads having a first material and second material, wherein the first material forms a first intermetallic compound with the solder at a first rate, and the pad material forms a second intermetallic compound with the solder at a second rate.

* * * * *

UNITED STATES PATENT AND TRADEMARK OFFICE
CERTIFICATE OF CORRECTION

PATENT NO. : 7,701,069 B2  Page 1 of 1
APPLICATION NO. : 10/610168
DATED : April 20, 2010
INVENTOR(S) : Leong et al.

It is certified that error appears in the above-identified patent and that said Letters Patent is hereby corrected as shown below:

In column 7, at line 11 delete, "bail" and insert --ball--.

In column 8, at line 48 delete, "bail" and insert --ball--.

Signed and Sealed this

Thirtieth Day of November, 2010

David J. Kappos
*Director of the United States Patent and Trademark Office*